United States Patent
Kato et al.

(10) Patent No.: US 8,817,144 B2
(45) Date of Patent: Aug. 26, 2014

(54) PHOTOELECTRIC CONVERSION APPARATUS

(75) Inventors: Taro Kato, Kawasaki (JP); Mineo Shimotsusa, Machida (JP); Hiroaki Sano, Machida (JP); Takeshi Ichikawa, Hachioji (JP); Yasuhiro Sekine, Yokohama (JP); Mahito Shinohara, Tokyo (JP); Genzo Momma, Hiratsuka (JP)

(73) Assignee: Canon Kabushiki Kaisha, Tokyo (JP)

( * ) Notice: Subject to any disclaimer, the term of this patent is extended or adjusted under 35 U.S.C. 154(b) by 224 days.

(21) Appl. No.: 13/365,146

(22) Filed: Feb. 2, 2012

(65) Prior Publication Data

US 2012/0200751 A1 Aug. 9, 2012

(30) Foreign Application Priority Data

Feb. 9, 2011 (JP) .................................. 2011-026353
Oct. 7, 2011 (JP) .................................. 2011-223301

(51) Int. Cl.
*H01L 21/00* (2006.01)

(52) U.S. Cl.
USPC ............................. 348/294; 348/335; 257/290

(58) Field of Classification Search
USPC .......... 348/294, 308, 340; 250/208.1; 257/40, 257/292, 294, 432
See application file for complete search history.

(56) References Cited

U.S. PATENT DOCUMENTS

| | | | |
|---|---|---|---|
| 2005/0236553 A1 | 10/2005 | Noto | |
| 2005/0274968 A1* | 12/2005 | Kuo et al. | 257/98 |
| 2006/0278948 A1* | 12/2006 | Yamaguchi et al. | 257/444 |
| 2007/0172970 A1* | 7/2007 | Uya | 438/22 |
| 2008/0037132 A1* | 2/2008 | Naya | 359/619 |

FOREIGN PATENT DOCUMENTS

| | | |
|---|---|---|
| CN | 1877867 A | 12/2006 |
| CN | 101924114 A | 12/2010 |
| JP | 2007-201091 A | 8/2007 |
| JP | 2007-227643 A | 9/2007 |
| JP | 2008-192951 A | 8/2008 |
| JP | 2009-099700 A | 5/2009 |
| JP | 2009-252983 A | 10/2009 |
| JP | 2009-283637 A | 12/2009 |
| JP | 2010-205994 A | 9/2010 |

* cited by examiner

*Primary Examiner* — Twyler Haskins
*Assistant Examiner* — Dwight C Tejano
(74) *Attorney, Agent, or Firm* — Canon USA Inc IP Division

(57) ABSTRACT

A photoelectric conversion apparatus includes a semiconductor substrate having a photoelectric conversion portion. An insulator is provided on the semiconductor substrate. The insulator has a hole corresponding to the photoelectric conversion portion. A waveguide member is provided in the hole. An in-layer lens is provided on a side of the waveguide member farther from the semiconductor substrate. A first intermediate member is provided between the waveguide member and the in-layer lens. The first intermediate member has a lower refractive index than the in-layer lens.

32 Claims, 6 Drawing Sheets

PHOTOELECTRIC CONVERSION APPARATUS

BACKGROUND OF THE INVENTION

1. Field of the Invention

The present invention relates to a photoelectric conversion apparatus.

2. Description of the Related Art

Recently proposed photoelectric conversion apparatuses include optical waveguides and in-layer lenses so as to increase the quantity of light to be incident on photoelectric conversion portions.

FIG. 8 of Japanese Patent Laid-Open No. 2007-201091 illustrates the following solid-state image pickup element as a photoelectric conversion apparatus. A planarizing layer having a through hole is provided on a semiconductor substrate having a photoelectric conversion portion. A first highly refractive material is provided over the planarizing layer such that the through hole is filled with the first highly refractive material, which forms an optical waveguide. An inner lens, as an in-layer lens, made of a second highly refractive material is provided on the first highly refractive material. A top microlens is provided on the inner lens.

FIG. 1 of Japanese Patent Laid-Open No. 2008-192951 illustrates the following solid-state image pickup apparatus as a photoelectric conversion apparatus. A plurality of interlayer dielectric films are stacked on a semiconductor substrate having photoelectric conversion elements. Openings are provided in portions of the stack of interlayer dielectric films in such a manner as to overlap the respective photoelectric conversion elements. Optical waveguides are embedded in the respective openings. In-layer lenses are provided on the respective optical waveguides. Top lenses are provided on the respective in-layer lenses.

In a photoelectric conversion apparatus to which the solid-state image pickup element disclosed by Japanese Patent Laid-Open No. 2007-201091 is applied, a film made of a highly refractive material that is the same as a material forming the in-layer lens is interposed between the in-layer lens and the optical waveguide. Therefore, some of light transmitted through the in-layer lens may not enter the optical waveguide. In the photoelectric conversion apparatus disclosed by Japanese Patent Laid-Open No. 2008-192951, each of the optical waveguides is in contact with a corresponding one of the in-layer lenses. In such a configuration, some of light incident on a peripheral region of the in-layer lens may not enter the optical waveguide.

The above situations are noticeable with light rays that are obliquely incident on the in-layer lens with respect to the optical axis. Therefore, in such a photoelectric conversion apparatus, there may be a difference in sensitivity between a group of pixels around the center of the image pickup area and a group of pixels near ends of the image pickup area. This is because pixels near ends of the image pickup area tend to receive more oblique light rays than pixels around the center of the image pickup area. This phenomenon becomes more noticeable as the image pickup area of the photoelectric conversion apparatus becomes larger.

SUMMARY OF THE INVENTION

According to a first aspect of the present invention, a photoelectric conversion apparatus includes a semiconductor substrate, a photoelectric conversion portion provided in the semiconductor substrate, an insulator provided on the semiconductor substrate, a first member provided on the semiconductor substrate and configured to overlap with the photoelectric conversion portion, a first lens provided on a farther side of the first member, farther from the photoelectric conversion portion and configured to condense light onto the first member, a second lens provided on a farther side of the first lens, farther from the photoelectric conversion portion, and a wavelength selecting member provided on the farther side of the first lens, farther from the photoelectric conversion portion. The photoelectric conversion portion and the first member are provided in line along a first direction. The insulator includes a first portion and a second portion that is different from the first portion. The first portion, the first member, and the second portion are provided in line along a second direction intersecting the first direction. The apparatus further includes a second member provided between the first member and the first lens. An area of the second member is larger than an area of the first member. A refractive index of a material included in the second member is lower than a refractive index of a material included in the first lens.

According to a second aspect of the present invention, a photoelectric conversion apparatus includes a semiconductor substrate, a photoelectric conversion portion provided in the semiconductor substrate. An insulator is provided on the semiconductor substrate. A first member is provided on the semiconductor substrate and configured to overlap with the photoelectric conversion portion. A lens is provided on a farther side of the first member, farther from the photoelectric conversion portion and is configured to condense light onto the first member. A wavelength selecting member is provided on a farther side of the lens, farther from the photoelectric conversion portion. The photoelectric conversion portion and the first member are provided in line along a first direction. The insulator includes a first portion and a second portion that is different from the first portion. The first portion, the first member, and the second portion are provided in line along a second direction intersecting the first direction. Only a film having a lower refractive index than the lens is provided between the lens and the first member and an area of the film is larger than an area of the first member.

According to a third aspect of the present invention, a photoelectric conversion apparatus includes a semiconductor substrate and a photoelectric conversion portion provided in the semiconductor substrate. An insulator is provided on the semiconductor substrate. A first member is provided on the semiconductor substrate and is configured to overlap with the photoelectric conversion portion. A lens is provided on a farther side of the first member, farther from the photoelectric conversion portion and is configured to condense light onto the first member. A first intermediate member is provided between the first member and the lens. A second intermediate member is provided between the first member and the first intermediate member. A third intermediate member is provided between the lens and the first intermediate member. The photoelectric conversion portion and the first member are provided in line along a first direction. The insulator includes a first portion and a second portion that is different from the first portion. The first portion, the first member, and the second portion are provided in line along a second direction intersecting the first direction. A refractive index nf1 of a material included in the lens, a refractive index nf2 of the third intermediate member, a refractive index nf3 of the first intermediate member, a refractive index nf4 of the second intermediate member, and a refractive index nf5 of the first member satisfy a relationship of nf1>nf5>nf2>nf4>nf3.

Further features of the present invention will become apparent from the following description of exemplary embodiments with reference to the attached drawings.

DESCRIPTION OF THE EMBODIMENTS

Figure 1:
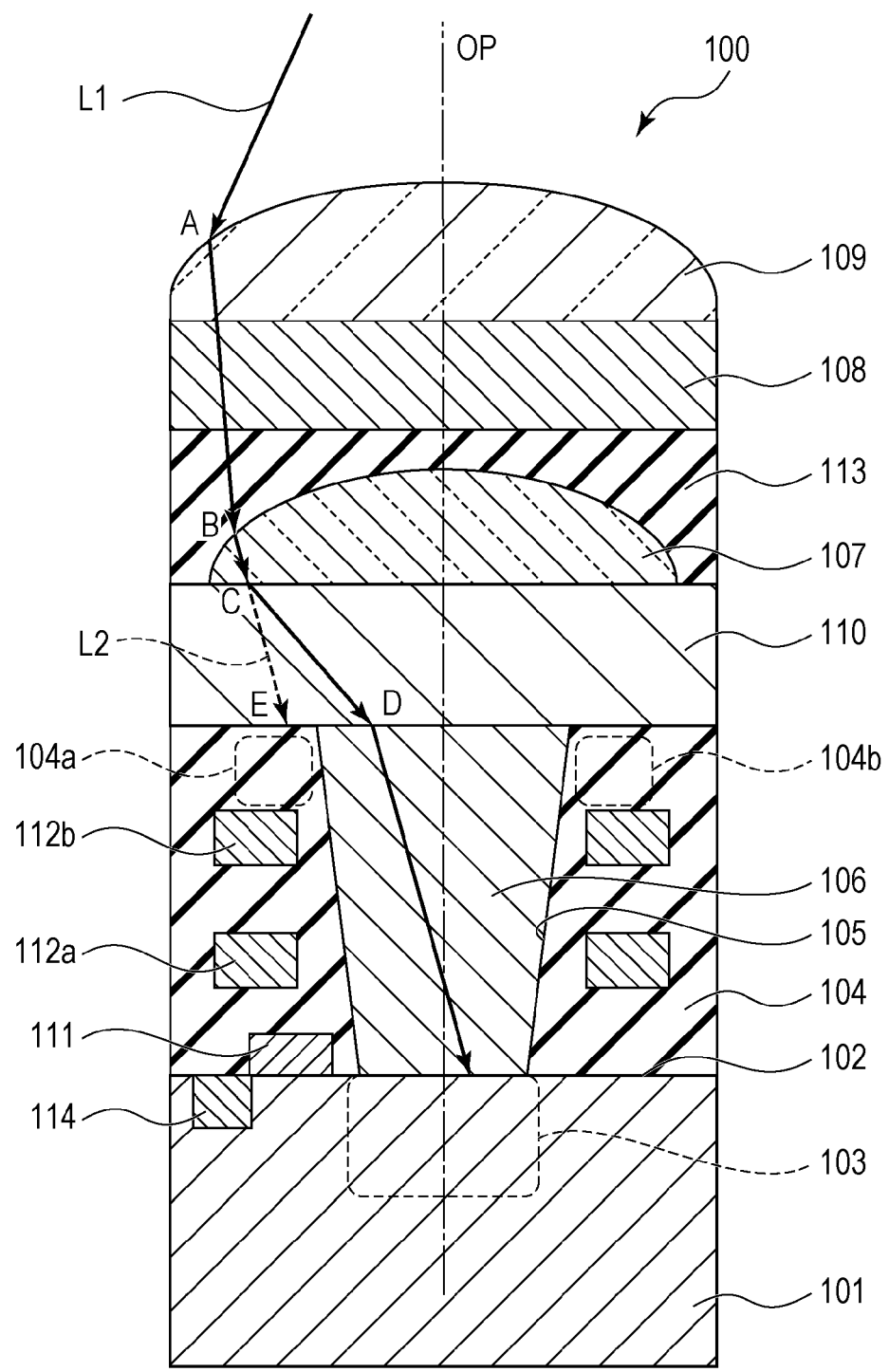
FIG. 1 is a schematic sectional view of a photoelectric conversion apparatus according to a first embodiment of the present invention.

A photoelectric conversion apparatus 100 according to a first aspect of the present invention will now be described (see FIG. 1). The photoelectric conversion apparatus 100 includes a semiconductor substrate 101. The semiconductor substrate 101 is a member made of a semiconductor material among members included in the photoelectric conversion apparatus 100. Examples of the semiconductor substrate 101 include a member manufactured from a semiconductor wafer subjected to a known semiconductor manufacturing process and thus having semiconductor regions. Examples of the semiconductor material include silicon. The interface between the semiconductor substrate 101 and another member is defined as a principal surface 102 of the semiconductor substrate 101. Examples of the other member include a thermal oxide film provided on, or in contact with, the semiconductor substrate 101.

In this specification, the term "plane" refers to a flat area extending parallel to the principal surface 102, specifically, part of the principal surface 102 in which a below-described photoelectric conversion portion is provided or part of the principal surface 102 in which a channel of a metal-oxide-semiconductor (MOS) transistor is provided. In this specification, the term "section" refers to a flat area intersecting the plane.

The semiconductor substrate 101 has a photoelectric conversion portion 103. An insulator 104 is provided on the principal surface 102 of the semiconductor substrate 101. The insulator 104 has a hole 105 corresponding to the photoelectric conversion portion 103.

The hole 105 is provided with a waveguide member 106 thereinside. In other words, the waveguide member 106 is provided on the semiconductor substrate 101 at a position overlapping the photoelectric conversion portion 103. The waveguide member 106 is surrounded by the insulator 104. The hole 105 may be fully filled with the waveguide member 106, or only part of the hole 105 may be filled with the waveguide member 106. A material included in the waveguide member 106 may have a higher refractive index than a material included in the insulator 104. In that case, the quantity of light that enters the waveguide member 106 but leaks out into the insulator 104 is reduced. Therefore, if at least part of the waveguide member 106 overlaps the photoelectric conversion portion 103, the quantity of light to be incident on the photoelectric conversion portion 103 increases.

The waveguide member 106 may not necessarily have a higher refractive index than the insulator 104. The waveguide member 106 exerts its light-guiding function as long as the waveguide member 106 has such a configuration that light having entered the waveguide member 106 does not leak out into the insulator 104 provided therearound. An exemplary configuration is as follows: a reflective member that reflects light is provided on the sidewall of the hole 105, and the remaining part of the hole 105 is filled with the waveguide member 106. Another exemplary configuration is as follows: there is an air gap between the waveguide member 106 provided in the hole 105 and the insulator 104. The air gap may be a vacuum or may be filled with gas. In such cases, the refractive index of the material included in the waveguide member 106 and the refractive index of the material included in the insulator 104 may have any relationship therebetween.

The positional relationship between the insulator 104 and the waveguide member 106 will now be described. In a certain plane, a region provided therein with the waveguide member 106 is surrounded by a region provided therein with the insulator 104 or is positioned between regions each provided therein with the insulator 104. In other words, in a direction intersecting a direction in which the photoelectric conversion portion 103 and the waveguide member 106 are provided in line, a first portion of the insulator 104, a second portion of the insulator 104 different from the first portion, and the waveguide member 106 are provided in line. The direction intersecting the direction in which the photoelectric conversion portion 103 and the waveguide member 106 are provided in line corresponds to, for example, a direction in which the principal surface 102 of the semiconductor substrate 101 extends. From a different perspective, the insulator 104 includes a first portion and a second portion that do not overlap the photoelectric conversion portion 103, and the waveguide member 106 is provided between the first portion and the second portion.

An in-layer lens 107 is provided on a farther side of the waveguide member 106 from the semiconductor substrate 101. In other words, the waveguide member 106 is positioned between the in-layer lens 107 and the semiconductor substrate 101. The in-layer lens 107 condenses light that enters the in-layer lens 107. To condense light onto the waveguide member 106 means to refract light toward the waveguide member 106. For example, light that enters the in-layer lens 107 from a surface of a farther side of the in-layer lens 107 with respect to the semiconductor substrate 101 is refracted toward an optical axis OP. The optical axis OP is a line passing through the center of a surface of a closer side of the in-layer lens 107 to the semiconductor substrate 101 and the center of a surface of a farther side of the waveguide member 106 from the semiconductor substrate 101. There may be some cases where the optical axis OP is not defined. Such a case is acceptable as long as light that has entered the in-layer lens 107 is refracted toward the waveguide member 106.

A wavelength selecting member 108 and a microlens 109 are provided on a farther side of the in-layer lens 107 from the semiconductor substrate 101. The wavelength selecting member 108 selectively allows light at a certain wavelength to be transmitted therethrough toward the photoelectric conversion portion 103. The wavelength selecting member 108 is provided on an optical path extending from an object of image pickup or a light source to the in-layer lens 107.

A first intermediate member 110 is provided between the waveguide member 106 and the in-layer lens 107. The first aspect of the present invention is characterized in that a material included in the first intermediate member 110 has a lower refractive index than a material included in the in-layer lens 107. Furthermore, the first intermediate member 110 has a larger area than the waveguide member 106. In this specification, the area of the first intermediate member 110 refers to an area on a certain plane defined by projecting the first intermediate member 110 onto the plane. The term "area" used for other members also means the same, unless otherwise specified. The first intermediate member 110 may be provided, for example, over the entirety of an image pickup area in which a plurality of photoelectric conversion portions 103 are provided. Moreover, the first intermediate member 110 may extend over the entirety of the semiconductor substrate 101, inclusive of areas having peripheral circuits.

In FIG. 1, arrow L1 represents an optical path of light that is incident on the semiconductor substrate 101. The light is emitted from an object of image pickup or a light source (not illustrated). The light enters the semiconductor substrate 101 from the principal surface 102. The light is first received by the microlens 109 (at point A). The light is condensed by the microlens 109 and is received by the in-layer lens 107 (at point B). The light is condensed by the in-layer lens 107 and is refracted at the interface (point C) between the in-layer lens 107 and the first intermediate member 110. At this point, since the first intermediate member 110 has a lower refractive index than the in-layer lens 107, the light condensed by the in-layer lens 107 is refracted toward the optical axis OP. Subsequently, the light enters the waveguide member 106 (from point D). Consequently, the quantity of light to be incident on the photoelectric conversion portion 103 increases.

Broken-line arrow L2 in FIG. 1 represents an optical path in a comparative example. In the comparative example, a member provided between the waveguide member 106 and the in-layer lens 107 has the same refractive index as the in-layer lens 107. In such a photoelectric conversion apparatus according to the comparative example, light is not refracted at an end (point C) of the in-layer lens 107 nearer to the semiconductor substrate 101. Therefore, light condensed by the in-layer lens 107 travels along the optical path represented by broken-line arrow L2 and is incident on a point (point E) where the waveguide member 106 is not present. The probability that the light not having entered the waveguide member 106 may not be incident on the photoelectric conversion portion 103 is high because of reflection by wiring or the like. Therefore, such a configuration may have low sensitivity.

A photoelectric conversion apparatus 600 according to a second aspect of the present invention will now be described (see FIG. 5). The photoelectric conversion apparatus 600 includes a semiconductor substrate 101. The semiconductor substrate 101 is a member made of a semiconductor material among members included in the photoelectric conversion apparatus 600. Examples of the semiconductor substrate 101 include a member manufactured from a semiconductor wafer subjected to a known semiconductor manufacturing process and thus having semiconductor regions. Examples of the semiconductor material include silicon. The interface between the semiconductor substrate 101 and another member is defined as a principal surface 102 of the semiconductor substrate 101. Examples of the other member include a thermal oxide film provided on, or in contact with, the semiconductor substrate 101.

The semiconductor substrate 101 has a photoelectric conversion portion 103. An insulator 104 is provided on the principal surface 102 of the semiconductor substrate 101. The insulator 104 has a hole 105 corresponding to the photoelectric conversion portion 103.

The hole 105 is provided with a waveguide member 106 thereinside. In other words, the waveguide member 106 is provided on the semiconductor substrate 101 at a position overlapping the photoelectric conversion portion 103. The waveguide member 106 is surrounded by the insulator 104. The hole 105 may be fully filled with the waveguide member 106, or only part of the hole 105 may be filled with the waveguide member 106. A material included in the waveguide member 106 may have a higher refractive index than a material included in the insulator 104. In that case, the quantity of light that enters the waveguide member 106 but leaks out into the insulator 104 is reduced. Therefore, if at least part of the waveguide member 106 overlaps the photoelectric conversion portion 103, the quantity of light to be incident on the photoelectric conversion portion 103 increases.

The waveguide member 106 may not necessarily have a higher refractive index than the insulator 104. The waveguide member 106 exerts its light-guiding function as long as the waveguide member 106 has such a configuration that light having entered the waveguide member 106 does not leak out into the insulator 104 provided therearound. An exemplary configuration is as follows: a reflective member that reflects light is provided on the sidewall of the hole 105, and the remaining part of the hole 105 is filled with the waveguide member 106. Another exemplary configuration is as follows: there is an air gap between the waveguide member 106 provided in the hole 105 and the insulator 104. The air gap may be a vacuum or may be filled with gas. In such cases, the refractive index of the material included in the waveguide member 106 and the refractive index of the material included in the insulator 104 may have any relationship therebetween.

The positional relationship between the insulator 104 and the waveguide member 106 will now be described. In a certain plane, a region provided therein with the waveguide member 106 is surrounded by a region provided therein with the insulator 104 or is positioned between regions each provided therein with the insulator 104. In other words, in a direction intersecting a direction in which the photoelectric conversion portion 103 and the waveguide member 106 are provided in line, a first portion of the insulator 104, a second portion of the insulator 104 different from the first portion, and the waveguide member 106 are provided in line. The direction intersecting the direction in which the photoelectric conversion portion 103 and the waveguide member 106 are provided in line corresponds to, for example, a direction in which the principal surface 102 of the semiconductor substrate 101 extends. From a different perspective, the insulator 104 includes a first portion and a second portion that do not overlap the photoelectric conversion portion 103, and the waveguide member 106 is provided between the first portion and the second portion.

A lens 107 is provided on a farther side of the waveguide member 106 from the semiconductor substrate 101. In other words, the waveguide member 106 is positioned between the in-layer lens 107 and the semiconductor substrate 101. The lens 107 condenses light that enters the lens 107. To condense light onto the waveguide member 106 means to refract light toward the waveguide member 106. For example, light that enters the lens 107 from a surface of a farther side of the lens 107 with respect to the semiconductor substrate 101 is refracted toward an optical axis OP. The optical axis OP is a line passing through the center of a surface of a closer side of the lens 107 to the semiconductor substrate 101 and the center of a farther side of a surface of the waveguide member 106 from the semiconductor substrate 101. There may be some cases where the optical axis OP is not defined. Such a case is acceptable as long as light that has entered the lens 107 is refracted toward the waveguide member 106.

A first intermediate member 601, a second intermediate member 602, and a third intermediate member 603 are provided between the waveguide member 106 and the lens 107. The second intermediate member 602 is provided between the first intermediate member 601 and the waveguide member 106. The third intermediate member 603 is provided between the first intermediate member 601 and the lens 107.

The second aspect of the present invention is characterized in that the lens 107, the waveguide member 106, the third intermediate member 603, the second intermediate member 602, and the first intermediate member 601 have higher refractive indices in that order. That is, letting the refractive indices of the material included in the lens 107, the third intermediate member 603, the first intermediate member 601, the second intermediate member 602, and the waveguide member 106 be nf1, nf2, nf3, nf4, and nf5, respectively, a relationship of nf1>nf5>nf2>nf4>nf3 holds.

Figure 5:
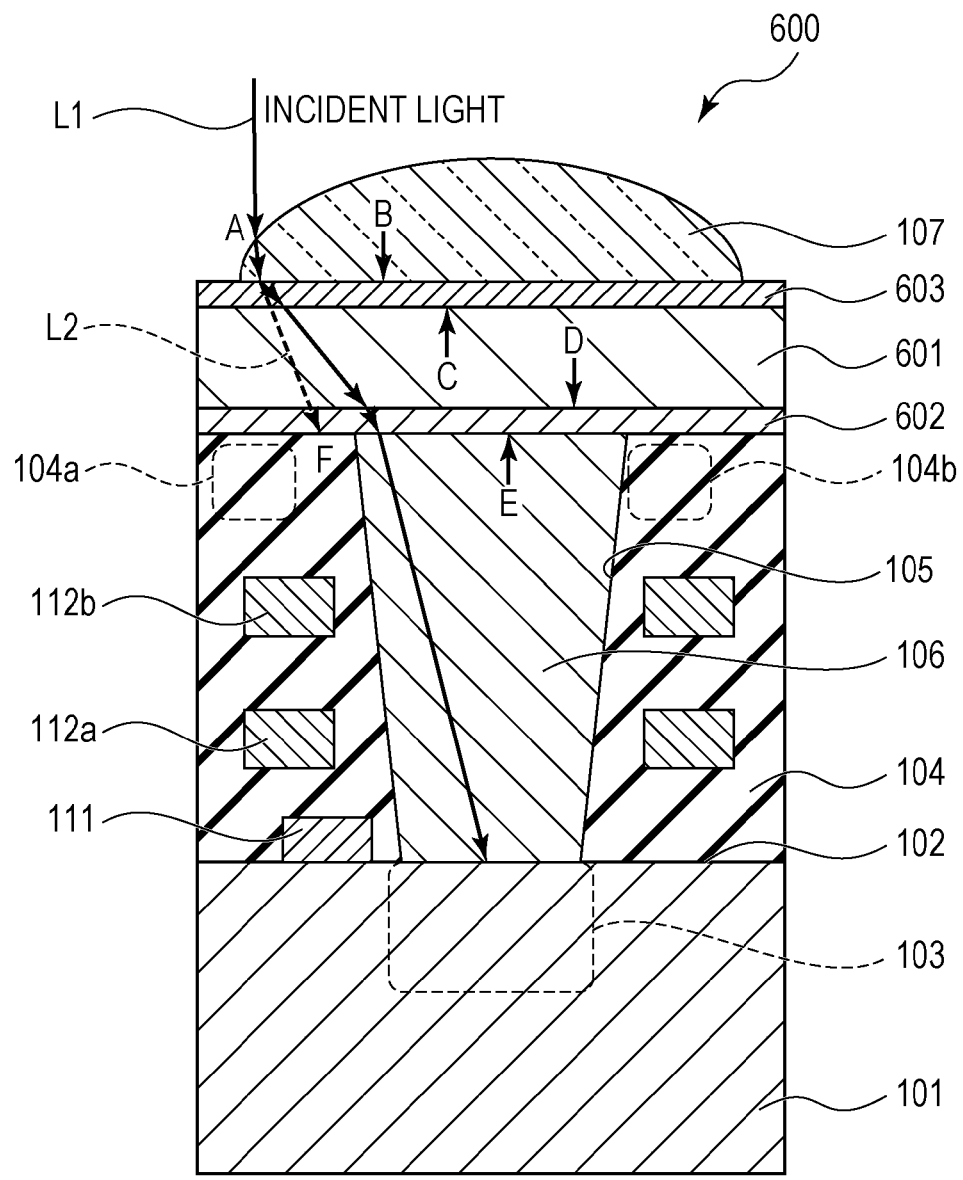
FIG. 5 is a schematic sectional view of a photoelectric conversion apparatus according to a fourth embodiment of the present invention.

In FIG. 5, arrow L1 represents an optical path of light that is incident on the semiconductor substrate 101. The light is emitted from an object of image pickup or a light source (not illustrated). The light enters the semiconductor substrate 101 from the principal surface 102. The light is first received by the lens 107 (at point A).

The relationship between the refractive indices of the lens 107 and the third intermediate member 603 is expressed by nf1>nf2. Therefore, the light condensed by the lens 107 is refracted at an interface B toward the center of the waveguide member 106. Since nf2>nf3, the light is further refracted at an interface C toward the center of the waveguide member 106. Since the relationship among the three refractive indices is expressed by nf1>nf2>nf3, the third intermediate member 603 functions as an antireflection film. Thus, the quantity of light to be taken into the waveguide member 106 increases.

The relationship between the refractive indices of the first intermediate member 601 and the second intermediate member 602 is expressed by nf3<nf4. Therefore, the light obliquely incident on an interface D is refracted such that the degree of obliqueness is reduced. Furthermore, since nf4<nf5, the light is refracted at an interface E such that the degree of obliqueness is further reduced, and enters the waveguide member 106. Furthermore, since the relationship among the three refractive indices is expressed by nf3<nf4<nf5, the second intermediate member 602 functions as an antireflection film. Thus, the quantity of light to be taken into the waveguide member 106, i.e., the quantity of light to be taken into the photoelectric conversion portion 103 (a photodiode), increases.

Broken-line arrow L2 in FIG. 5 represents an optical path in a comparative example. In the comparative example, a member provided between the waveguide member 106 and the lens 107 has the same refractive index as the lens 107. In such a photoelectric conversion apparatus according to the comparative example, light is not refracted at an end (point B) of the lens 107 nearer to the semiconductor substrate 101. Therefore, light condensed by the lens 107 travels along the optical path represented by broken-line arrow L2 and is incident on a point (point F) where the waveguide member 106 is not present. The probability that the light not having entered the waveguide member 106 may not be incident on the photoelectric conversion portion 103 is high because of reflection by wiring or the like. Therefore, such a configuration may have low sensitivity.

First Embodiment

A photoelectric conversion apparatus 100 according to a first embodiment of the present invention will now be described with reference to relevant drawings. FIG. 1 is a schematic sectional view of the photoelectric conversion apparatus 100 according to the first embodiment. In FIG. 1, one photoelectric conversion portion 103 is illustrated. Alternatively, an array of plurality of photoelectric conversion portions 103 may be provided. The following description concerns a case where electrons function as signal carriers. Alternatively, holes may function as signal carriers. If holes function as signal carriers, the type of conduction between the semiconductor regions is reversed.

The photoelectric conversion apparatus 100 includes a semiconductor substrate 101. In the first embodiment, the semiconductor substrate 101 is an n-epitaxial layer. The semiconductor substrate 101 includes p-semiconductor regions and n-semiconductor regions. The semiconductor substrate 101 may include p-wells and/or n-wells. The semiconductor substrate 101 has a principal surface 102. In the first embodiment, the principal surface 102 is the interface between the semiconductor substrate 101 and a thermal oxide film (not illustrated) provided on the semiconductor substrate 101. Light enters the semiconductor substrate 101 from the principal surface 102.

The photoelectric conversion portion 103 is, for example, a photodiode. In the first embodiment, the photoelectric conversion portion 103 includes an n-semiconductor region, which forms a p-n junction in combination with a p-semiconductor region provided adjacent thereto. Electric charge generated by photoelectric conversion is gathered to the n-semiconductor region in the photoelectric conversion portion 103. The p-semiconductor region may be provided in a region of the photoelectric conversion portion 103 that is in contact with the principal surface 102.

A floating diffusion region (hereinafter abbreviated to FD) 114 is an n-semiconductor region. The charge generated by the photoelectric conversion portion 103 is transferred to the FD 114, where the charge is converted into voltage. The FD 114 is electrically connected to the input node of an amplifier (not illustrated) or to a signal output line. A gate electrode 111 is provided on the semiconductor substrate 101 with a thermal oxide film (not illustrated) interposed therebetween. The gate electrode 111 controls the transfer of charge between the photoelectric conversion portion 103 and the FD 114.

An insulator 104 is provided on the semiconductor substrate 101. In the first embodiment, a material forming the insulator 104 is silicon oxide film. The material forming the insulator 104 is not limited to a silicon oxide film and only needs to be insulative. The insulator 104 may not necessarily be in contact with the semiconductor substrate 101. The material forming the insulator 104 has a refractive index of, for example, 1.40 to 1.60. A first wiring layer 112a and a second wiring layer 112b are provided on the semiconductor substrate 101. In the first embodiment, conducting members included in the first wiring layer 112a and the second wiring layer 112b are made of copper. Alternatively, the conducting members may be made of any conducting material. Part of the conducting member of the first wiring layer 112a and part of the conducting member of the second wiring layer 112b may be electrically connected to each other with a contact (not illustrated). Excluding the parts that are electrically connected to each other with the contact, the conducting member of the first wiring layer 112a and the conducting member of the second wiring layer 112b are insulated from each other with the insulator 104. That is, the insulator 104 may include an interlayer dielectric film. The number of wiring layers provided is not limited to two and may be one, or three or more.

The insulator 104 has a hole 105 corresponding to the photoelectric conversion portion 103. In sectional view, the hole 105 may not necessarily extend through the insulator 104. The hole 105 may be a depression provided in the insulator 104. In plan view, the edge of the hole 105 forms a closed loop, such as a circular or rectangular shape. Alternatively, the hole 105 may have a groove-like shape, in plan view, extending over a plurality of photoelectric conversion portions 103. That is, in this specification, the insulator 104 is considered to have the hole 105 if, in a certain plane, an area not having the insulator 104 is surrounded by an area having the insulator 104 or is positioned between areas each having the insulator 104. The area not having the insulator 104 may not necessarily be an air gap.

The hole 105 is provided at such a position that at least part thereof overlap the photoelectric conversion portion 103 in plan view. That is, when the hole 105 and the photoelectric conversion portion 103 are projected onto a certain plane, an area in which both the hole 105 and the photoelectric conversion portion 103 are projected is present in that plane.

A waveguide member 106 is provided in the hole 105. In the first embodiment, the waveguide member 106 is made of silicon nitride film. Alternatively, the waveguide member 106 may be made of silicon oxynitride film or an organic material (a resin such as polyimide polymer). Preferably, the waveguide member 106 may be made of a material that transmits light or electromagnetic waves at a wavelength selected by a below-described wavelength selecting member. The waveguide member 106 may have a higher refractive index than the insulator 104. The refractive index of the waveguide member 106 is, for example, 1.60 or higher, or preferably 1.80 or higher. In the first embodiment, the refractive index of the silicon nitride film falls within the range of 1.70 to 2.30.

In the first embodiment, the hole 105 is fully filled with the waveguide member 106. Alternatively, only part of the hole 105 may be filled with the waveguide member 106. Moreover, the waveguide member 106 may include a plurality of materials. In that case, one of the plurality of materials may have a higher refractive index than the insulator 104. For example, the waveguide member 106 may be a combination of a silicon nitride film and a silicon oxynitride film. Alternatively, a silicon nitride film may be provided over the sidewall and near the bottom of the hole 105, and the remaining part of the hole 105 is filled with an organic material that is superior in ease of embedding compared with the silicon nitride film.

Referring to FIG. 1, the insulator 104 includes a first portion 104a and a second portion 104b. The first portion 104a and the second portion 104b are provided in different regions. As illustrated in FIG. 1, the waveguide member 106 is provided between the first portion 104a and the second portion 104b; or the first portion 104a, the second portion 104b, and the waveguide member 106 are provided side by side in a direction intersecting a direction in which the photoelectric conversion portion 103 and the waveguide member 106 are provided side by side. The direction intersecting the direction in which the photoelectric conversion portion 103 and the waveguide member 106 are provided side by side corresponds to, for example, a direction in which the principal surface 102 of the semiconductor substrate 101 extends. In FIG. 1, the direction in which the photoelectric conversion portion 103 and the waveguide member 106 are provided side by side is orthogonal to the direction in which the first portion 104a, the second portion 104b, and the waveguide member 106 are provided side by side. In some cases, the photoelectric conversion portion 103 and the waveguide member 106 may be provided side by side in a direction angled with respect to the perpendicular line standing from the principal surface 102 of the semiconductor substrate 101. In such a case, the direction in which the photoelectric conversion portion 103 and the waveguide member 106 are provided side by side may not necessarily be orthogonal to the direction in which the first portion 104a, the second portion 104b, and the waveguide member 106 are provided side by side.

In FIG. 1, the first portion 104a and the second portion 104b do not overlap the photoelectric conversion portion 103. Alternatively, part of the insulator 104 may overlap the photoelectric conversion portion 103. Actually, there is no border between each of the first portion 104a and the second portion 104b and the insulator 104 provided therearound. The first portion 104a, the second portion 104b, and the insulator 104 are made of the same material.

In the first embodiment, a distance from a surface of the waveguide member 106 that is farther, or more remote, from the semiconductor substrate 101 to the principal surface 102 is longer than a distance from a surface of the conducting member included in the second wiring layer 112b that is farther, or more remote, from the semiconductor substrate 101 to the principal surface 102. Furthermore, a distance from a surface of the waveguide member 106 that is nearer, or closer, to the semiconductor substrate 101 to the principal surface 102 is shorter than a distance from a surface of the conducting member included in the first wiring layer 112a nearer to the semiconductor substrate 101 to the principal surface 102. The waveguide member 106 and the wiring layers 112a and 112b are not limited to such a positional relationship. For example, the distance from the surface of the waveguide member 106 that is nearer, or closer, to the semiconductor substrate 101 to the principal surface 102 may be shorter than a distance from a surface of the conducting member included in the second wiring layer 112b that is nearer, or closer, to the semiconductor substrate 101 to the principal surface 102 and longer, or greater, than a distance from a surface of the conducting member included in the first wiring layer 112a that is farther, or more remote, from the semiconductor substrate 101 to the principal surface 102. In FIG. 1, the waveguide member 106 is in contact with the semiconductor substrate 101. Alternatively, the surface of the waveguide member 106 that is nearer, or closer, to the semiconductor substrate 101 may be at a certain distance from the principal surface 102. For example, a protective film or an antireflection film may be interposed between the waveguide member 106 and the semiconductor substrate 101.

An in-layer lens 107 is provided on a side of the waveguide member 106 farther, or more remote, from the semiconductor substrate 101. In the first embodiment, the in-layer lens 107 is a silicon nitride film. The refractive index of the material forming the in-layer lens 107 is, for example, 1.80 or higher. An interlayer dielectric film 113 is provided on a side of the in-layer lens 107 farther, or more remote, from the semiconductor substrate 101. In the first embodiment, the interlayer dielectric film 113 is a silicon oxide film. The material forming the interlayer dielectric film 113 may have a lower refractive index than the material forming the in-layer lens 107. A surface of the in-layer lens 107 that is farther, or more remote, from the semiconductor substrate 101 is convex toward the side farther from the semiconductor substrate 101. Light is condensed in accordance with the convex shape of the interface between the interlayer dielectric film 113 and the in-layer lens 107 and the difference in refractive index between the interlayer dielectric film 113 and the in-layer lens 107.

If the in-layer lens 107 is made of a single material as in the first embodiment, the refractive index of the material forming the in-layer lens 107 is determined as the refractive index of that material. Examples of such a material include an inorganic compound, a polymer, and the like. A polymer in this case may be composed of polymerized monomers of a certain kind or of different kinds.

The in-layer lens 107 may not necessarily be made of a single material as in the first embodiment and may be made of a plurality of materials that are mixed together. For example, the in-layer lens 107 may be made of an organic resin in which inorganic beads are dispersed. If the in-layer lens 107 is made of a plurality of materials that are evenly mixed together, the refractive index of the material forming the in-layer lens 107 is determined as the refractive index of the mixture of the plurality of materials. If the diameter of each bead is sufficiently small relative to the wavelength, the refractive index of the mixture can be calculated from the individual refractive indices and the volume ratio of the plurality of materials included in the mixture.

The in-layer lens 107 may not necessarily have an even distribution of refractive index. For example, the in-layer lens 107 may include a plurality of portions that are made of different materials having different refractive indices. Alternatively, in the case where the in-layer lens 107 is made of an organic resin in which inorganic beads are dispersed, if the beads are not evenly dispersed, the in-layer lens 107 may have an uneven distribution of refractive index. Alternatively, the following is also acceptable: a resin curable with ultraviolet rays and a resin not curable with ultraviolet rays are evenly mixed together and formed into a lens-shaped member, and ultraviolet rays are applied to part of the lens-shaped member, whereby an in-layer lens 107 having an uneven distribution of refractive index is provided.

If the in-layer lens 107 has an uneven distribution of refractive index, the refractive index of the material forming the in-layer lens 107 may be regarded as the refractive index of a material forming a portion of the in-layer lens 107 nearest to the semiconductor substrate 101. If the refractive index in the portion of the in-layer lens 107 nearest to the semiconductor substrate 101 varies in the direction in which the principal surface 102 extends, the lowest one of refractive indices may be taken as the refractive index of the material forming the in-layer lens 107.

If the in-layer lens 107 includes a plurality of portions, the material forming the interlayer dielectric film 113 may have a lower refractive index than a material forming one of the portions of the in-layer lens 107 that is in contact with the interlayer dielectric film 113. If the in-layer lens 107 has an uneven distribution of refractive index, the material forming the interlayer dielectric film 113 may have a lower refractive index than the material forming the portion of the in-layer lens 107 that is in contact with the interlayer dielectric film 113.

According to need, a surface of the interlayer dielectric film 113 farther, or more remote, from the semiconductor substrate 101 may be planarized. For example, the interlayer dielectric film 113 may be planarized by chemical mechanical planarization (CMP). Moreover, a film having a refractive index that is intermediate between the refractive index of the interlayer dielectric film 113 and the refractive index of the in-layer lens 107 may be interposed between the interlayer dielectric film 113 and the in-layer lens 107.

A wavelength selecting member 108 is provided on the side of the in-layer lens 107 farther, or more remote, from the semiconductor substrate 101. The wavelength selecting member 108 is, for example, a color filter. The color filter is made of, for example, organic resin that transmits light at a certain wavelength but absorbs light at other wavelengths. The wavelength selecting member 108 may alternatively be a prism that separates only light at a certain wavelength from light at the other wavelengths. The wavelength selecting member 108 may have a function of converting light at a certain wavelength into light at another wavelength. For example, the wavelength selecting member 108 may be a scintillator. The position of the wavelength selecting member 108 is not limited to the position illustrated in FIG. 1. The wavelength selecting member 108 only needs to be provided at a position on the optical path extending from an object of image pickup or a light source to the in-layer lens 107.

A microlens 109 is provided on a side of the wavelength selecting member 108 farther, or more remote, from the semiconductor substrate 101. In the first embodiment, the microlens 109 is made of organic resin. The microlens 109 has a function of condensing light incident thereon.

A first intermediate member 110 is generally provided between the in-layer lens 107 and the waveguide member 106. In the first embodiment, the first intermediate member 110 is a silicon oxide film. The material forming the first intermediate member 110 has a lower refractive index than the material forming the in-layer lens 107. If the in-layer lens 107 includes a plurality of portions, the material forming the first intermediate member 110 has a lower refractive index than a material forming one of the plurality of portions of the in-layer lens 107 that is nearest to the semiconductor substrate 101. The ratio of the refractive index of the first intermediate member 110 to the refractive index of the material forming the in-layer lens 107 is, for example, 0.95 or smaller, or preferably 0.85 or smaller. The refractive index of the first intermediate member 110 is, for example, 1.40 to 1.60, or preferably 1.40 to 1.50. The first intermediate member 110 may be transparent with respect to light or electromagnetic waves at a wavelength selected by the wavelength selecting member 108. The refractive index of the first intermediate member 110 may not necessarily be even in the planar direction. The first intermediate member 110 may include a region having a relatively low refractive index and a region having a relatively high refractive index.

In the first embodiment, the first intermediate member 110 is provided over the entirety of an image pickup area in which a plurality of photoelectric conversion portions 103 are provided. The first intermediate member 110 may alternatively be provided over the entirety of the semiconductor substrate 101. The first intermediate member 110, however, may not necessarily be provided over the entirety of the image pickup area. In general, the first intermediate member 110 only needs to have a larger area than the waveguide member 106.

Specifically, the area defined by the plan-view contour of the first intermediate member 110 only needs to be larger than the plan-view area of the waveguide member 106. For example, in plan view, the first intermediate member 110 may not necessarily be present in a central portion of the waveguide member 106. That is, the first intermediate member 110 may have a ring-like shape in plan view. In such a case, a situation where the area actually occupied by the first intermediate member 110 is smaller than the area of the waveguide member 106 is acceptable, as long as the area defined by the contour of the first intermediate member 110 is larger than the area of the waveguide member 106.

A comparative embodiment will now be described in which the first intermediate member 110 has a smaller area than the waveguide member 106. In the comparative embodiment, the first intermediate member 110 does not extend over the entirety of the waveguide member 106. In an area where the first intermediate member 110 is not present, light is not condensed by refraction. Therefore, the quantity of light that enters the waveguide member 106 is reduced.

The first intermediate member 110 has a thickness of, for example, 60 nm to 500 nm, or preferably 80 nm to 120 nm. The thickness of the first intermediate member 110 refers to a distance from a surface of the first intermediate member 110 nearer to the semiconductor substrate 101 to a surface of the first intermediate member 110 remoter from the semiconductor substrate 101. The thickness of the first intermediate member 110 may be less than the height of the waveguide member 106. A distance from the surface of the in-layer lens 107 nearer to the semiconductor substrate 101 to the surface of the waveguide member 106 remoter from the semiconductor substrate 101 is, for example, shorter than 700 nm.

Figure 2:
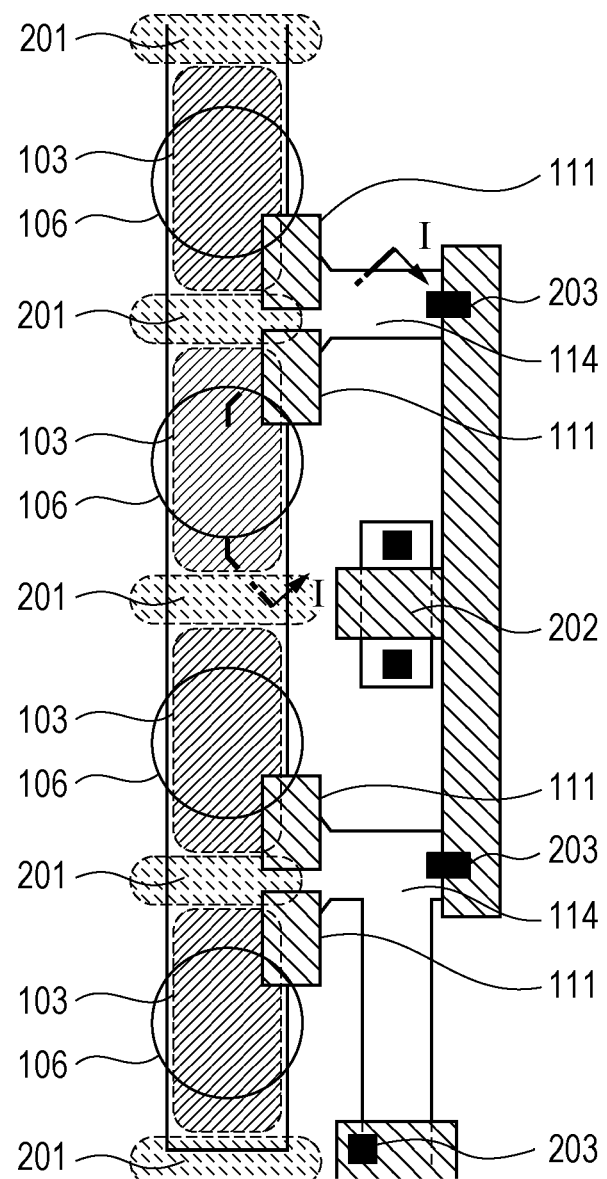
FIG. 2 is a schematic plan view of the photoelectric conversion apparatus according to the first embodiment.

FIG. 2 is a schematic plan view of the photoelectric conversion apparatus 100 according to the first embodiment. The sectional view illustrated in FIG. 1 is taken along line I-I illustrated in FIG. 2. Elements functioning the same as those illustrated in FIG. 1 are denoted by corresponding reference numerals. FIG. 2 illustrates four photoelectric conversion portions 103. Here, as a matter of convenience, n-semiconductor regions included in the respective photoelectric conversion portions 103 are illustrated as the photoelectric conversion portions 103. A potential barrier 201 to signal carriers is provided between each adjacent two of the photoelectric conversion portions 103. The potential barrier 201 functions as an element isolation region that prevents signal carriers from being transferred between two adjacent photoelectric conversion portions 103 (photodiodes). The four photoelectric conversion portions 103 are provided with four respective gate electrodes 111. In the first embodiment, one FD 114 is provided for a plurality of photoelectric conversion portions 103. In other words, electrons of a plurality of photoelectric conversion portions 103 are transferred to one FD 114. In the first embodiment, a plurality of FD's 114 are electrically connected to each other with a wire 202. The FD's 114 are electrically connected to the wire 202 with shared contacts 203. Thus, in terms of a circuit, electrons of the four photoelectric conversion portions 103 are transferred to one node. The wire 202 is provided integrally with the gate electrode of the amplifier transistor (not illustrated). At least one of the plurality of FD's 114 that are electrically connected to each other also functions as the source or drain of a reset transistor, which has a gate electrode 203.

As illustrated in FIG. 2, each waveguide member 106 overlaps a corresponding one of the photoelectric conversion portions 103. The plan-view shape of the waveguide member 106 is not limited to a circle as illustrated in FIG. 2 and may alternatively be, for example, a polygon such as a rectangle, or an ellipse. While part of the photoelectric conversion portion 103 does not overlap the waveguide member 106 in FIG. 2, the entirety of the photoelectric conversion portion 103 may overlap the waveguide member 106.

In FIG. 2, the first intermediate member 110 is provided over the entirety of the semiconductor substrate 101. Accordingly, the first intermediate member 110 has a larger area than the waveguide member 106. The first intermediate member 110, however, may not necessarily be provided over the entirety of the semiconductor substrate 101. Moreover, a plurality of first intermediate members 110 may be provided in correspondence with a plurality of waveguide members 106, whether they are provided as an integral body or not.

As described above, in the first embodiment, the first intermediate member 110 having a lower refractive index than the in-layer lens 107 is provided between the in-layer lens 107 and the waveguide member 106. Furthermore, the first intermediate member 110 has a larger area than the waveguide member 106. Thus, the quantity of light that enters the waveguide member 106 increases.

As long as light is made to enter the waveguide member 106, the light propagates through to the photoelectric conversion portion 103. Light not entering the waveguide member 106 is regarded as a loss in the form of reflection by wiring or the like. Particularly, if wiring is provided around the waveguide member 106, the size of the entrance of the waveguide member 106 has an upper limit. In this respect, the in-layer lens 107 may have a larger area than the entrance of the waveguide member 106. In such a configuration, the advantageous effect of the present invention becomes noticeable.

To allow the waveguide member 106 to let light propagate through to the photoelectric conversion portion 103, the refractive index of the waveguide member 106 is desired to be as high as possible. In this respect, the waveguide member 106 may have a higher refractive index than the first intermediate member 110. If the waveguide member 106 is made of a plurality of materials, the highest one of refractive indices of the plurality of materials of the waveguide member 106 may be higher than the refractive index of the first intermediate member 110.

Second Embodiment

Figure 3:
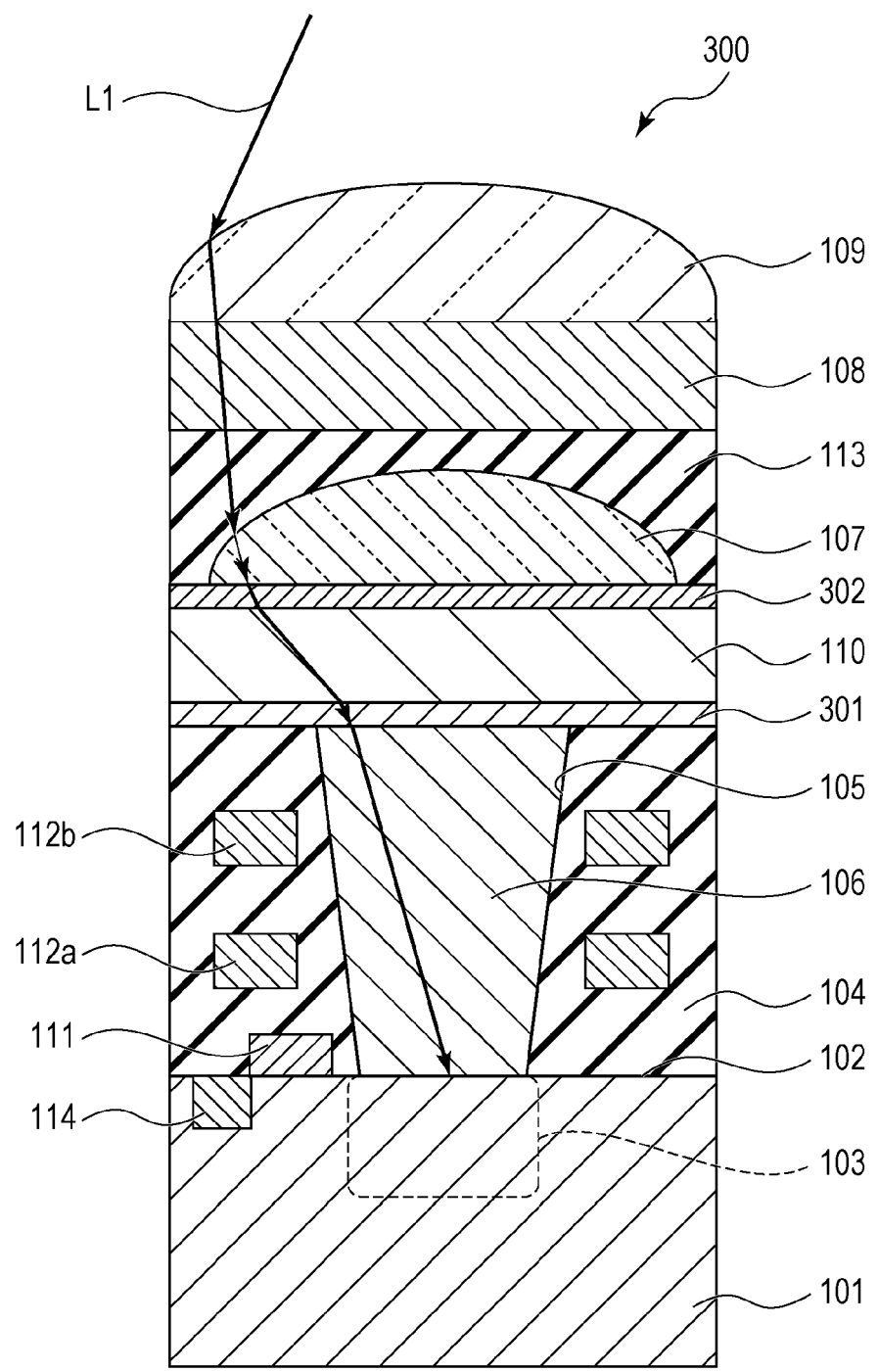
FIG. 3 is a schematic sectional view of a photoelectric conversion apparatus according to a second embodiment of the present invention.

A photoelectric conversion apparatus 300 according to a second embodiment of the present invention will now be described with reference to relevant drawings. FIG. 3 is a schematic sectional view of the photoelectric conversion apparatus 300 according to the second embodiment. Elements functioning the same as those illustrated in FIG. 1 are denoted by corresponding reference numerals, and detailed description thereof is omitted.

The second embodiment is characterized in that a second intermediate member 301 is provided between the waveguide member 106 and the first intermediate member 110, and a third intermediate member 302 is provided between the first intermediate member 110 and the in-layer lens 107. The refractive index of the second intermediate member 301 is higher than the refractive index of the first intermediate member 110 and lower than the refractive index of the waveguide member 106. The refractive index of the third intermediate member 302 is higher than the refractive index of the first intermediate member 110 and lower than the refractive index of the material forming the in-layer lens 107. The refractive indices of the second intermediate member 301 and the third intermediate member 302 are, for example, 1.60 to 1.80. The refractive index of the second intermediate member 301 is preferably the average of the refractive indices of the waveguide member 106 and the first intermediate member 110. Furthermore, the refractive index of the third intermediate member 302 is preferably the average of the refractive indices of the first intermediate member 110 and the material forming the in-layer lens 107. In the second embodiment, the second intermediate member 301 and the third intermediate member 302 are each a silicon oxynitride film, which has a refractive index of about 1.72.

With the presence of the second intermediate member 301 and the third intermediate member 302, the reflection of incident light is reduced. In general, in a case where light travels from a medium having a refractive index n1 to a medium having a refractive index n2, the reflectance becomes higher as the difference between n1 and n2 becomes larger. Since the second intermediate member 301 having a refractive index that is intermediate between the refractive indices of the waveguide member 106 and the first intermediate member 110 is provided between the waveguide member 106 and the first intermediate member 110, the difference in refractive index at the interface between the two is reduced. Consequently, the reflectance of light that travels through the first intermediate member 110 and is incident on the waveguide member 106 becomes lower than that in the case where the waveguide member 106 and the first intermediate member 110 are in contact with each other. Likewise, since the third intermediate member 302 having a refractive index that is intermediate between the refractive indices of the first intermediate member 110 and the in-layer lens 107 is provided between the first intermediate member 110 and the in-layer lens 107, the difference in refractive index at the interface between the two is reduced. Consequently, the reflectance of light that travels through the in-layer lens 107 and is incident on the first intermediate member 110 is lowered.

The extent of lowering of reflectance achieved with the presence of the second intermediate member 301 varies with the relationship among a thickness d of the second intermediate member 301, a refractive index N of the second intermediate member 301, and a wavelength p of incident light. This is because multiple reflections at a plurality of interfaces cancel out one another. Theoretically, the reflectance is most lowered when Expression (1) given below holds:

$$d = \frac{p}{4N}(2k+1) \quad (1)$$

where k is an integer of 0 or greater.

That is, when the thickness of the second intermediate member 301 is an odd multiple of p/4N, the reflectance is most lowered, theoretically. Therefore, the thickness of the second intermediate member 301 can be set on the basis of Expression (1) above. Preferably, the thickness of the second intermediate member 301 satisfies Expression (2) given below:

$$\frac{p}{4N}(2k+0.5) < d < \frac{p}{4N}(2k+1.5) \quad (2)$$

where k is most preferably 0.

For example, suppose that the refractive index of the first intermediate member 110 is 1.45, the refractive index of the second intermediate member 301 is 1.72, the refractive index of the waveguide member 106 is 2.00, and the wavelength of incident light is 550 nm. Here, if the thickness of the second intermediate member 301 is 80 nm, the transmittance of light traveling from the first intermediate member 110 through to the waveguide member 106 is about 1.00. Meanwhile, in the case where the first intermediate member 110 and the waveguide member 106 are in contact with each other, the foregoing transmittance is about 0.97.

The extent of lowering of reflectance achieved with the presence of the third intermediate member 302 also varies with the relationship among the thickness and refractive index of the third intermediate member 302 and the wavelength of incident light. Therefore, the thickness of the third intermediate member 302 can be set on the basis of the above theory.

In the second embodiment, the first intermediate member 110, the second intermediate member 301, and the third intermediate member 302 are provided between the in-layer lens 107 and the waveguide member 106. Therefore, the thicknesses of the foregoing members can be set on the basis of the above theory.

The second intermediate member 301 and the third intermediate member 302 may each have a smaller thickness than the first intermediate member 110. This is because of the following reason. In a case where the distance between the in-layer lens 107 and the waveguide member 106 is constant, the advantageous effect of the present invention becomes more noticeable as the proportion of members having relatively low refractive indices becomes higher.

The configuration according to the second embodiment includes both the second intermediate member 301 and the third intermediate member 302. Alternatively, only one of the second intermediate member 301 and the third intermediate member 302 may be provided. In that case also, the reflectance is lowered.

Third Embodiment

Figure 4:
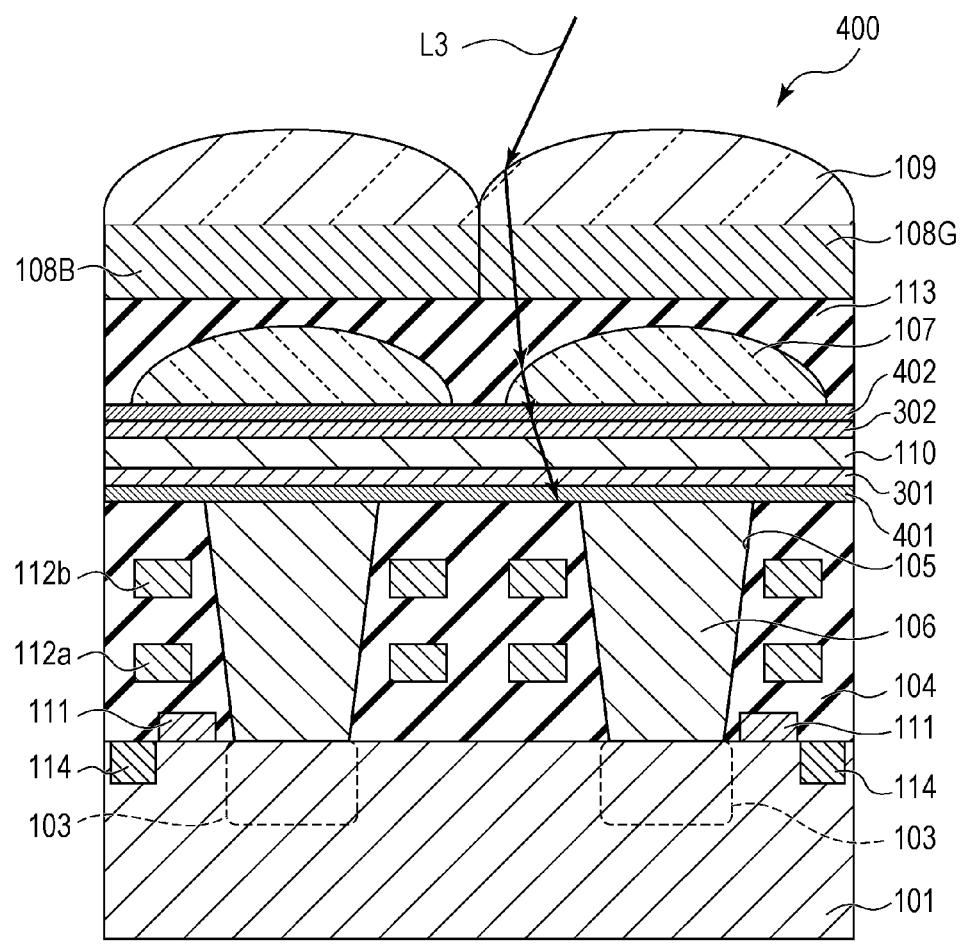
FIG. 4 is a schematic sectional view of a photoelectric conversion apparatus according to a third embodiment of the present invention.

A photoelectric conversion apparatus 400 according to a third embodiment of the present invention will now be described with reference to relevant drawings. FIG. 4 is a schematic sectional view of the photoelectric conversion apparatus 400 according to the third embodiment. Elements functioning the same as those illustrated in FIGS. 1 and 3 are denoted by corresponding reference numerals, and detailed description thereof is omitted. In FIG. 4, a plurality of pixels are illustrated. Redundant description of elements included in all pixels and having the same functions is omitted.

The third embodiment is characterized in that a fourth intermediate member 401 is provided between the first intermediate member 110 and the waveguide members 106. The fourth intermediate member 401 is in contact with the waveguide members 106. The fourth intermediate member 401 extends between adjacent ones of a plurality of photoelectric conversion portions 103. The fourth intermediate member 401 is made of the same material as the waveguide members 106.

With the presence of the fourth intermediate member 401, the quantity of light that enters the waveguide member 106 increases. In FIG. 4, arrow L3 represents an optical path of light that has entered the photoelectric conversion apparatus 400. Some of light having been incident on a region where the waveguide member 106 is not present (light represented by arrow L3) may not be incident on the photoelectric conversion portion 103 because of reflection by wiring or the like. Nevertheless, with the presence of the fourth intermediate member 401 extending between adjacent ones of the plurality of photoelectric conversion portions 103, such light enters the fourth intermediate member 401. The light having entered the fourth intermediate member 401 propagates through the fourth intermediate member 401 and enters the waveguide member 106. Thus, with the presence of the fourth intermediate member 401, the quantity of light that enters the waveguide member 106 increases. Consequently, the sensitivity of the photoelectric conversion apparatus 400 increases.

In the third embodiment, a fifth intermediate member 402 is provided between the in-layer lens 107 and the first intermediate member 110. The fifth intermediate member 402 is in contact with the in-layer lens 107. The fifth intermediate member 402 extends between adjacent ones of the plurality of photoelectric conversion portions 103. The fifth intermediate member 402 is made of the same material as the in-layer lens 107.

A wavelength selecting member 108G provided for one of the pixels on the right in FIG. 4 basically selects light at a green wavelength. A wavelength selecting member 108B provided for the other pixel on the left in FIG. 4 basically selects light at a blue wavelength.

Fourth Embodiment

A photoelectric conversion apparatus 600 according to a fourth embodiment of the present invention will now be described with reference to relevant drawings. FIG. 5 is a schematic sectional view of the photoelectric conversion apparatus 600 according to the fourth embodiment. Elements functioning the same as those illustrated in FIG. 3 are denoted by corresponding reference numerals, and detailed description thereof is omitted.

The fourth embodiment differs from the second embodiment in that the lens 107, the waveguide member 106, a third intermediate member 603, a second intermediate member 602, and a first intermediate member 601 have higher refractive indices in that order. That is, letting the refractive indices of the material forming the lens 107, the third intermediate member 603, the first intermediate member 601, the second intermediate member 602, and the waveguide member 106 be nf1, nf2, nf3, nf4, and nf5, respectively, a relationship of nf1>nf5>nf2>nf4>nf3 holds. The arrangement of the foregoing members may be the same as that in the second embodiment.

The refractive index nf2 of the third intermediate member 603 may be close to the mean value (average) of nf1 and nf3. Furthermore, the refractive index nf4 of the second intermediate member 602 may be close to the mean value (average) of nf3 and nf5.

In the fourth embodiment, members provided above the lens 107 in the other embodiments are omitted. Specifically, the wavelength selecting member 108, the microlens 109, and the interlayer dielectric film 113 provided in the other embodiments are omitted. Of course, modifications in which the foregoing members are provided are included in the scope of the present invention.

The configurations and arrangement of the lens 107, the waveguide member 106, the third intermediate member 603, the second intermediate member 602, and the first intermediate member 601 are the same as in the second embodiment. The fourth embodiment is characterized by the relationship among the refractive indices of these members. Therefore, for example, a modification in which the first intermediate member 601 has a smaller area than the waveguide member 106 also produces the advantageous effect of the fourth embodiment. That is, such a modification is also included in the scope of the present invention.

Except the points described above, the configuration according to the fourth embodiment is the same as the configuration according to any of the first to third embodiments. Therefore, a modification of the fourth embodiment provided as a combination with one or more of the configurations according to the first to third embodiments is also included in the scope of the present invention.

According to the fourth embodiment, a member having a relatively low refractive index is provided between the lens 107 and the waveguide member 106. Thus, the quantity of light to be incident on the photoelectric conversion portion 103 increases. Furthermore, according to the fourth embodiment, the second intermediate member 602 and the third intermediate member 603 are provided between the lens 107 and the waveguide member 106. The second intermediate member 602 and the third intermediate member 603 can function as antireflection films. Therefore, the influence of reflection of light at the interfaces is reduced.

Fifth Embodiment

Figure 6:
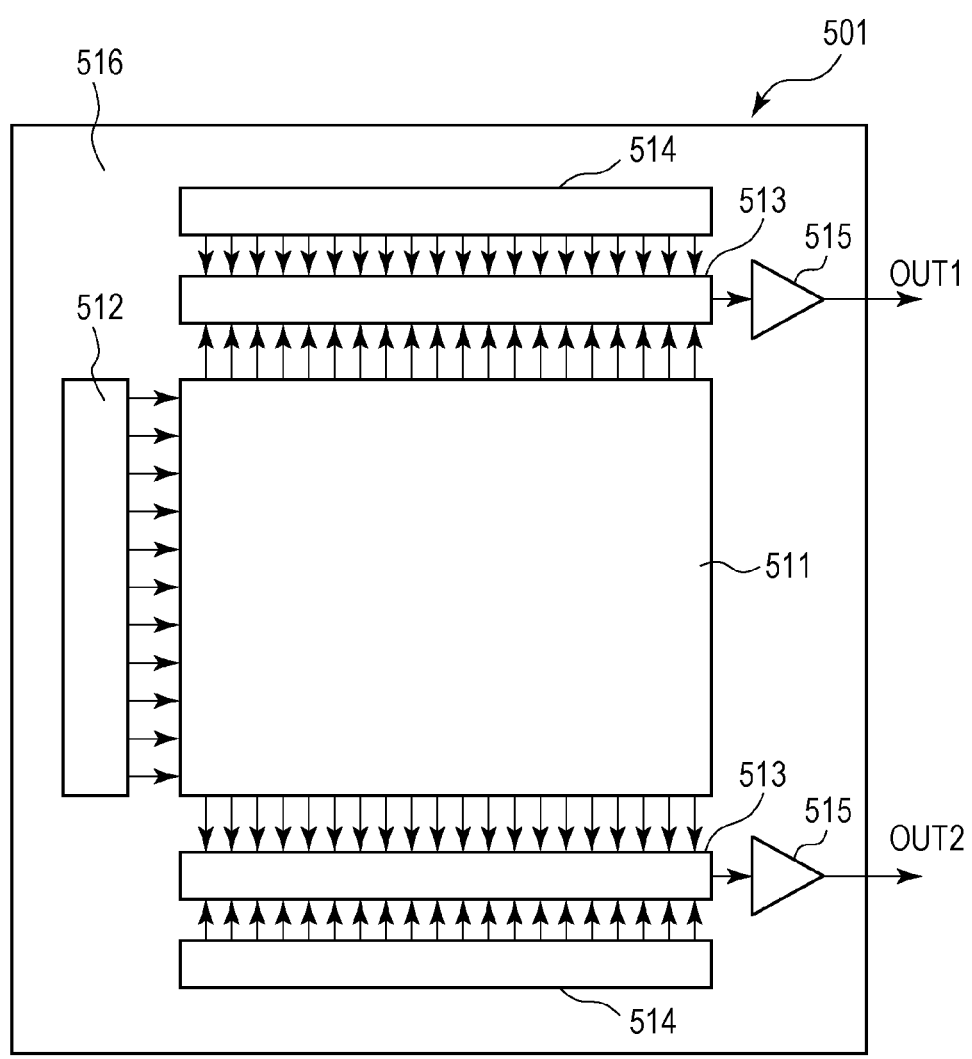
FIG. 6 is a schematic plan view of a photoelectric conversion apparatus according to a fifth embodiment of the present invention.

FIG. 6 schematically illustrates a photoelectric conversion apparatus 501 according to a fifth embodiment of the present invention. In the fifth embodiment, a complementary-metal-oxide-semiconductor (CMOS) photoelectric conversion apparatus is taken as an exemplary photoelectric conversion apparatus. The photoelectric conversion apparatus 501 illustrated in FIG. 6 includes an image pickup area 511, a vertical scan circuit 512, two read circuits 513, two horizontal scan circuits 514, and two output amplifiers 515. The area excluding the image pickup area 511 is a circuit area 516.

In the image pickup area 511, a plurality of pixels are provided in the form of a two-dimensional array. Each of the pixels may have any of the configurations illustrated in FIGS. 1 to 5. The read circuits 513 include, for example, column amplifiers, correlated-double-sampling (CDS) circuits, adding circuits, and so forth and perform amplification, addition, and so forth on signals that are read, through vertical signal lines, from pixels in rows selected by the vertical scan circuit 512. For example, one column amplifier, one CDS circuit, one adding circuit, and so forth are provided for each pixel column or for a plurality of pixel columns. The horizontal scan circuits 514 generate signals for sequentially reading the signals of the respective read circuits 513. The output amplifiers 515 amplify and output the signals of the columns selected by the respective horizontal scan circuits 514.

The above configuration is only an exemplary configuration of the photoelectric conversion apparatus, and the fifth embodiment is not limited thereto. There are two output lines each including one read circuit 513, one horizontal scan circuit 514, and one output amplifier 515. Therefore, the two output lines are provided on the upper and lower sides, respectively, of the image pickup area 511. Alternatively, three or more output lines may be provided.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-026353 filed Feb. 9, 2011 and No. 2011-223301 filed Oct. 7, 2011, which are hereby incorporated by reference herein in their entirety.

What is claimed is:
1. A photoelectric conversion apparatus comprising:
a semiconductor substrate;
a photoelectric conversion portion provided in the semiconductor substrate;
an insulator provided on the semiconductor substrate;
a first member provided on the semiconductor substrate and configured to overlap with the photoelectric conversion portion;
a first lens provided on the first member and configured to condense light onto the first member;
a wavelength selecting member provided on the first lens
a second member provided between the first member and the first lens, and
a third member provided between the first member and the second member,
wherein the photoelectric conversion portion and the first member are provided in line along a first direction, wherein the insulator includes a first portion and a second portion that is different from the first portion, wherein the first portion, the first member, and the second portion are provided in line along a second direction intersecting the first direction, wherein a refractive index of a material included in the second member is lower than a refractive index of a material included in the first lens, wherein the refractive index of the material included in the second member is lower than a refractive index of a material included in the first member, wherein a refractive index of a material included in the third member is lower than the refractive index of the material included in the first member and higher than the refractive index of the material included in the second member.

2. The photoelectric conversion apparatus according to claim 1, satisfying the following expressions:

$$d1 > p/8X$$

$$d1 < 3p/8X$$

where d1 denotes a thickness of the third member, X denotes the refractive index of the material included in the third member, and p denotes a wavelength of light selected by the wavelength selecting member.

3. The photoelectric conversion apparatus according to claim 1, further comprising a fourth member provided between the second member and the first lens, wherein a refractive index of a material included in the fourth member is lower than the refractive index of the material included in the first lens and higher than the refractive index of the material included in the second member.

4. The photoelectric conversion apparatus according to claim 3, satisfying the following expressions:

$$d2 > p/8Y$$

$$d2 < 3p/8Y$$

where d2 denotes a thickness of the fourth member, Y denotes the refractive index of the material included in the fourth member, and p denotes a wavelength of light selected by the wavelength selecting member.

5. The photoelectric conversion apparatus according to claim 1, further comprising a wiring layer including a conducting member, wherein a first distance from the semiconductor substrate to a surface of the farther side of the first member from the semiconductor substrate is longer than a second distance from the semiconductor substrate to a surface of the farther side of the conducting member from the semiconductor substrate, and wherein a third distance from the semiconductor substrate to a surface of a closer side of the first member to the semiconductor substrate is shorter than a fourth distance from the semiconductor substrate to a surface of a closer side of the conducting member to the semiconductor substrate.

6. The photoelectric conversion apparatus according to claim 1, wherein the semiconductor substrate includes an image pickup area provided therein with a plurality of photoelectric conversion portions, and a circuit area provided therein with a circuit configured to process signals from the photoelectric conversion portions, and wherein the second member is provided at least over the entirety of the image pickup area.

7. The photoelectric conversion apparatus according to claim 1, wherein a refractive index of a material included in the first member is higher than a refractive index of the first portion and a refractive index of the second portion.

8. The photoelectric conversion apparatus according to claim 1, wherein a reflective member configured to reflect light passing through the first member is provided between the first member and the first portion.

9. The photoelectric conversion apparatus according to claim 1, wherein an air gap is provided between the first member and the first portion.

10. The photoelectric conversion apparatus according to claim 1, further comprising:

another photoelectric conversion portion different from the photoelectric conversion portion; and a film provided on the farther side of the first member, farther from the photoelectric conversion portions and made of the same material as the first member, wherein the film is in contact with the first member, the first portion, and the second portion, and wherein the film extends to a region between the photoelectric conversion portion and the other photoelectric conversion portion.

11. The photoelectric conversion apparatus according to claim 1, wherein an area of a surface of a closer side of the first lens to the semiconductor substrate is larger than an area of a surface of the farther side of the first member from the photoelectric conversion portion.

12. The photoelectric conversion apparatus according to claim 1, further comprising:

a second lens provided on the first lens.

13. The photoelectric conversion apparatus according to claim 1, wherein an area of the second member is larger than an area of the first member.

14. The photoelectric conversion apparatus according to claim 1, wherein the first member forms a waveguide.

15. A photoelectric conversion apparatus comprising:

a semiconductor substrate;

a photoelectric conversion portion provided in the semiconductor substrate;

an insulator provided on the semiconductor substrate;

a first member provided on the semiconductor substrate and configured to overlap with the photoelectric conversion portion;

a lens provided on a farther side of the first member, farther from the photoelectric conversion portion and configured to condense light onto the first member; and a wavelength selecting member provided on a farther side of the lens, farther from the photoelectric conversion portion;

wherein the photoelectric conversion portion and the first member are provided in line along a first direction, wherein the insulator includes a first portion and a second portion that is different from the first portion, wherein the first portion, the first member, and the second portion are provided in line along a second direction intersecting the first direction, wherein only a film having a lower refractive index than the lens is provided between the lens and the first member, and wherein an area of the film is larger than an area of the first member.

16. A photoelectric conversion apparatus comprising:
a semiconductor substrate;
a photoelectric conversion portion provided in the semiconductor substrate;
an insulator provided on the semiconductor substrate;
a first member provided on the semiconductor substrate and configured to overlap with the photoelectric conversion portion;
a lens provided on a farther side of the first member, farther from the photoelectric conversion portion and configured to condense light onto the first member;
a first intermediate member provided between the first member and the lens;
a second intermediate member provided between the first member and the first intermediate member; and
a third intermediate member provided between the lens and the first intermediate member,
wherein the photoelectric conversion portion and the first member are provided in line along a first direction,
wherein the insulator includes a first portion and a second portion that is different from the first portion,
wherein the first portion, the first member, and the second portion are provided in line along a second direction intersecting the first direction, and
wherein a refractive index nf1 of a material included in the lens, a refractive index nf2 of the third intermediate member, a refractive index nf3 of the first intermediate member, a refractive index nf4 of the second intermediate member, and a refractive index nf5 of the first member satisfy a relationship of nf1>nf5>nf2>nf4>nf3.

17. A photoelectric conversion apparatus comprising:
a semiconductor substrate;
a photoelectric conversion portion provided in the semiconductor substrate;
an insulator provided on the semiconductor substrate;
a first member provided on the semiconductor substrate and configured to overlap with the photoelectric conversion portion;
a first lens provided on the first member and configured to condense light onto the first member;
a wavelength selecting member provided on the first lens;
a second member provided between the first member and the first lens, and
a fourth member provided between the second member and the first lens,
wherein the photoelectric conversion portion and the first member are provided in line along a first direction,
wherein the insulator includes a first portion and a second portion that is different from the first portion,
wherein the first portion, the first member, and the second portion are provided in line along a second direction intersecting the first direction,
wherein a refractive index of a material included in the second member is lower than a refractive index of a material included in the first lens, and
wherein a refractive index of a material included in the fourth member is lower than the refractive index of the material included in the first lens and higher than the refractive index of the material included in the second member.

18. The photoelectric conversion apparatus according to claim 17, satisfying the following expressions:

$$d2 > p/8Y$$

$$d2 < 3p/8Y$$

where d2 denotes a thickness of the fourth member, Y denotes the refractive index of the material included in the fourth member, and p denotes a wavelength of light selected by the wavelength selecting member.

19. The photoelectric conversion apparatus according to claim 17, further comprising a wiring layer including a conducting member,
wherein a first distance from the semiconductor substrate to a surface of the farther side of the first member from the semiconductor substrate is longer than a second distance from the semiconductor substrate to a surface of the farther side of the conducting member from the semiconductor substrate, and
wherein a third distance from the semiconductor substrate to a surface of a closer side of the first member to the semiconductor substrate is shorter than a fourth distance from the semiconductor substrate to a surface of a closer side of the conducting member to the semiconductor substrate.

20. The photoelectric conversion apparatus according to claim 17,
wherein the semiconductor substrate includes an image pickup area provided therein with a plurality of photoelectric conversion portions, and a circuit area provided therein with a circuit configured to process signals from the photoelectric conversion portions, and
wherein the second member is provided at least over the entirety of the image pickup area.

21. The photoelectric conversion apparatus according to claim 17, wherein a refractive index of a material included in the first member is higher than a refractive index of the first portion and a refractive index of the second portion.

22. The photoelectric conversion apparatus according to claim 17, wherein a reflective member configured to reflect light passing through the first member is provided between the first member and the first portion.

23. The photoelectric conversion apparatus according to claim 17, wherein an air gap is provided between the first member and the first portion.

24. The photoelectric conversion apparatus according to claim 17, further comprising:
another photoelectric conversion portion different from the photoelectric conversion portion; and
a film provided on the farther side of the first member, farther from the photoelectric conversion portions and made of the same material as the first member,
wherein the film is in contact with the first member, the first portion, and the second portion, and
wherein the film extends to a region between the photoelectric conversion portion and the other photoelectric conversion portion.

25. The photoelectric conversion apparatus according to claim 17, wherein an area of a surface of a closer side of the first lens to the semiconductor substrate is larger than an area of a surface of the farther side of the first member from the photoelectric conversion portion.

26. The photoelectric conversion apparatus according to claim 17, further comprising:
a second lens provided on the first lens.

27. The photoelectric conversion apparatus according to claim 17,
wherein an area of the second member is larger than an area of the first member.

28. The photoelectric conversion apparatus according to claim 17,
wherein the first member forms a waveguide.

29. A photoelectric conversion apparatus comprising:
a semiconductor substrate;
a photoelectric conversion portion provided in the semiconductor substrate;
an insulator provided on the semiconductor substrate;
a first member provided on the semiconductor substrate and configured to overlap with the photoelectric conversion portion;
a first lens provided on the first member and configured to condense light onto the first member;
a wavelength selecting member provided on the first lens; and
a second member provided between the first member and the first lens,
wherein the photoelectric conversion portion and the first member are provided in line along a first direction,
wherein the insulator includes a first portion and a second portion that is different from the first portion,
wherein the first portion, the first member, and the second portion are provided in line along a second direction intersecting the first direction,
wherein a refractive index of a material included in the second member is lower than a refractive index of a material included in the first lens,
wherein the photoelectric conversion apparatus further comprises a wiring layer including a conducting member,
wherein a first distance from the semiconductor substrate to a surface of the farther side of the first member from the semiconductor substrate is longer than a second distance from the semiconductor substrate to a surface of the farther side of the conducting member from the semiconductor substrate, and
wherein a third distance from the semiconductor substrate to a surface of a closer side of the first member to the semiconductor substrate is shorter than a fourth distance from the semiconductor substrate to a surface of a closer side of the conducting member to the semiconductor substrate.

30. A photoelectric conversion apparatus comprising:
a semiconductor substrate;
a photoelectric conversion portion provided in the semiconductor substrate;
an insulator provided on the semiconductor substrate;
a first member provided on the semiconductor substrate and configured to overlap with the photoelectric conversion portion;
a first lens provided on the first member and configured to condense light onto the first member;
a wavelength selecting member provided on the first lens; and
a second member provided between the first member and the first lens,
wherein the photoelectric conversion portion and the first member are provided in line along a first direction,
wherein the insulator includes a first portion and a second portion that is different from the first portion,
wherein the first portion, the first member, and the second portion are provided in line along a second direction intersecting the first direction,
wherein a refractive index of a material included in the second member is lower than a refractive index of a material included in the first lens,
wherein the semiconductor substrate includes an image pickup area provided therein with a plurality of photoelectric conversion portions, and a circuit area provided therein with a circuit configured to process signals from the photoelectric conversion portions, and
wherein the second member is provided at least over the entirety of the image pickup area.

31. A photoelectric conversion apparatus comprising:
a semiconductor substrate;
a photoelectric conversion portion provided in the semiconductor substrate;
an insulator provided on the semiconductor substrate;
a first member provided on the semiconductor substrate and configured to overlap with the photoelectric conversion portion;
a first lens provided on the first member and configured to condense light onto the first member;
a wavelength selecting member provided on the first lens; and
a second member provided between the first member and the first lens,
wherein the photoelectric conversion portion and the first member are provided in line along a first direction,
wherein the insulator includes a first portion and a second portion that is different from the first portion,
wherein the first portion, the first member, and the second portion are provided in line along a second direction intersecting the first direction,
wherein a refractive index of a material included in the second member is lower than a refractive index of a material included in the first lens,
wherein the photoelectric conversion apparatus further comprises:
  another photoelectric conversion portion different from the photoelectric conversion portion; and
  a film provided on the farther side of the first member, farther from the photoelectric conversion portions and made of the same material as the first member,
wherein the film is in contact with the first member, the first portion, and the second portion, and
wherein the film extends to a region between the photoelectric conversion portion and the other photoelectric conversion portion.

32. A photoelectric conversion apparatus comprising:
a semiconductor substrate;
a photoelectric conversion portion provided in the semiconductor substrate;
an insulator provided on the semiconductor substrate;
a first member provided on the semiconductor substrate and configured to overlap with the photoelectric conversion portion;
a first lens provided on the first member and configured to condense light onto the first member;
a wavelength selecting member provided on the first lens; and
a second member provided between the first member and the first lens,
wherein the photoelectric conversion portion and the first member are provided in line along a first direction,
wherein the insulator includes a first portion and a second portion that is different from the first portion,
wherein the first portion, the first member, and the second portion are provided in line along a second direction intersecting the first direction,
wherein a refractive index of a material included in the second member is lower than a refractive index of a material included in the first lens, and
wherein an area of a surface of a closer side of the first lens to the semiconductor substrate is larger than an area of a surface of the farther side of the first member from the photoelectric conversion portion.

* * * * *